United States Patent [19]

Nishitoba et al.

[11] Patent Number: 4,509,494
[45] Date of Patent: Apr. 9, 1985

[54] PULSE WIDTH CONTROL CIRCUIT

[75] Inventors: Shigeo Nishitoba; Hirokazu Fukaya, both of Tokyo, Japan

[73] Assignee: Nippon Electric Company, Ltd., Japan

[21] Appl. No.: 386,489

[22] Filed: Jun. 9, 1982

[30] Foreign Application Priority Data

Jun. 12, 1981 [JP]  Japan ................................. 56-90240

[51] Int. Cl.³ .............................................. F02P 9/00
[52] U.S. Cl. ................................ 123/609; 307/10 R; 307/265
[58] Field of Search ..................... 307/10 R, 106, 265, 307/268, 355, 356; 123/406, 415, 426, 478, 609, 644

[56] References Cited

U.S. PATENT DOCUMENTS 3,820,029  6/1974  McKinley ........................... 307/265
3,946,302  3/1976  Kovalick et al. ................... 307/265

Primary Examiner—A. D. Pellinen
Assistant Examiner—Todd E. DeBoer
Attorney, Agent, or Firm—Remy J. VanOphem

[57] ABSTRACT

In a pulse width control circuit receiving a periodic input signal and controlling the width of an output pulse by means of a negative feedback loop, the value of power source voltage is detected and when a prescribed power source voltage is detected, the amount of the negative feedback is varied in response to the detection of the prescribed power source voltage to vary the width of the output pulse correspondingly.

5 Claims, 11 Drawing Figures

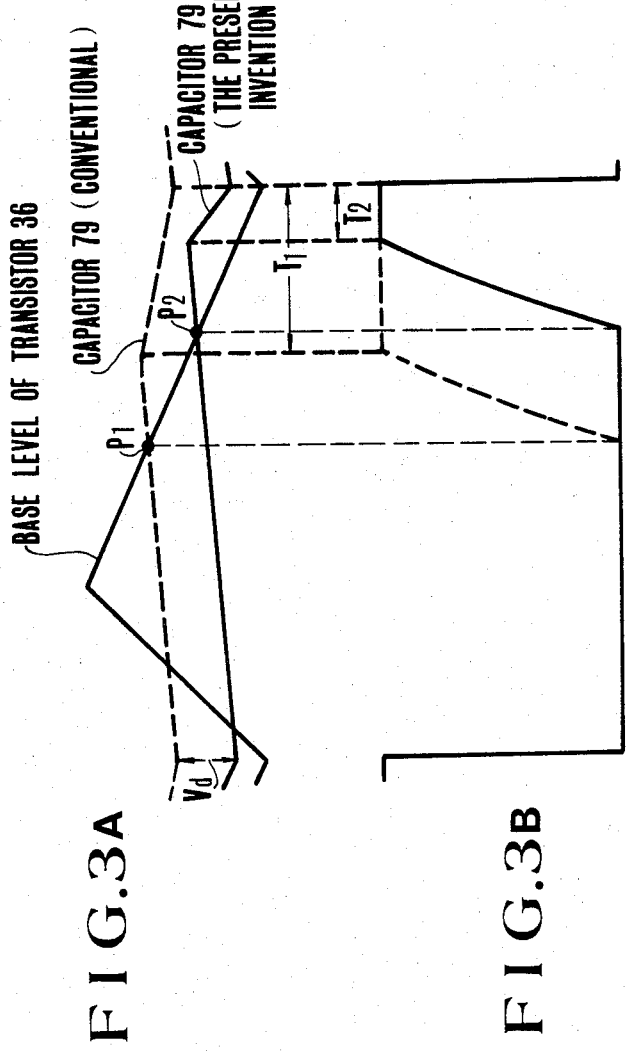

PULSE WIDTH CONTROL CIRCUIT

BACKGROUND OF THE INVENTION

This invention relates to a pulse width control circuit, and more particularly to a pulse width control circuit of the type which controls the output pulse width by means of a feedback loop.

Exemplarily, an ignition unit for an internal combustion engine employs a pulse width control circuit. Typically, the internal combustion engine ignition unit has a signal generator, built in a distributor, which produces a signal output synchronized with the rotation of the engine. The signal output is then processed by an amplifier having a waveform shaper and a driver circuit, which drives an output transistor loaded with an ignition coil to generate a high voltage across a secondary winding of the ignition coil. This high voltage is applied via the distributor to an ignition plug for firing the same.

In recent years, such ignition devices are required to produce increasingly higher outputs for the purpose of meeting stringent exhaust gas controls and improving the efficiency of fuel combustion. For production of high outputs, there may be available a method which is directed to increasing the magnitude of electric current $I_{L1}$ which flows through the primary winding of the ignition coil. Here, electric current $I_{L1}$ and energy $E_{L1}$ on the primary side of the ignition coil can be expressed as follows:

$$I_{L1} = (V_{cc}/R_{L1}) \cdot (1 - e^{-(R_{L1}/L_1)t}) \quad (1)$$

$$E_{L1} = \tfrac{1}{2} L_1 \cdot I_{L1}^2 \quad (2)$$

wherein, $V_{cc}$ denotes the power source voltage, $L_1$ denotes the inductance on the primary side of the ignition coil, $R_{L1}$ denotes the resistance on the primary side of the ignition coil, t denotes time, and e denotes natural logarithm.

From the foregoing formulas, it is self-evident that an increase in electric current $I_{L1}$, on the primary side of the ignition coil, is effective for increasing the output of the ignition unit. The signals to be generated by the signal generator built in the distributor have periods varying in a very wide range of 500 ms to 5 ms, for example, and in this range of signal periods, sufficient energy must be constantly supplied to the primary side of the ignition coil. Thus, it becomes necessary to decrease the time constant by decreasing the inductance on the primary side. When the time constant is decreased, however, the electric current $I_{L1}$, as is noted from formular (1), flows excessively when the engine is operated at a medium to low speed, although the magnitude of the electric current is proper and moderate at a high speed of the engine operation. To avoid this inconvenience, when reaching a prescribed magnitude, the electric current needs to be suppressed so that this prescribed magnitude may be kept. For a successful increase of the output of the ignition unit, therefore, it is necessary to adopt a method which effects the current suppression in the range of low to medium engine speed.

In this current suppression, collector voltage $V_c$ of the output transistor under the current suppression condition is given by the following equation:

$$P_c = V_{cc} - I_{L1} \cdot R_{L1} \quad (3)$$

Let $P_c$ stand for electric power consumed by the output transistor under the current suppression condition, and the following equation will be satisfied.

$$T_c = (V_{cc} - I_{L1} \cdot R_{L1}) \cdot I_{L1} \cdot D \quad (4)$$

where, D denotes a percentage of time for current suppression within the signal period.

From the equation (4), it is seen that, in the current suppression method, the electric power $P_c$ consumed by the output transistor increases in proportion as the power source voltage $V_{cc}$ increases because the electric current $I_{L1}$ on the primary side of the ignition coil is fixed to the prescribed value. This fact implies that if the amplifier of the ignition unit is constructed in the form of a semiconductor integrated circuit, having an amplifier chip, an output transistor chip and passive elements such as capacitors and resistors unified in the form of a thick-film hybrid integrated circuit on a single substrate, then temperatures of junctions in the semiconductor integrated circuit will be greatly affected by the electric power consumed by the output transistor. Particularly, it is very difficult to maintain the junction temperature constantly below the maximum allowable level under the conditions of high power source voltage and high temperature because thermal design for thermal resistance of the substrate between the output transistor chip and the thick-film hybrid integrated circuit faces extreme difficulties when taking the harsh environmental conditions inevitably encountered by the ignition device of the internal combustion engine.

SUMMARY OF THE INVENTION

The object of the present invention is to eliminate the conventional disadvantages mentioned above, and to provide a pulse width control circuit capable of positively controlling the pulse width of electric current flowing through the output transistor, particularly under the condition of current suppression, in accordance with power source voltage in excess of a prescribed value, thereby decreasing electric power consumption.

According to the present invention, to accomplish the above object, a pulse width control circuit receiving a periodic input signal, and controlling the width of an output pulse by means of a negative feedback loop, includes means for detecting the value of the power source voltage, means for varying the amount of feedback in the feedback loop in accordance with a detected power source voltage of a prescribed value, and means for correspondingly varying the width of the output pulse.

Advantageously, in accordance with the present invention, the amount of feedback so changes as to decrease the D when the power source voltage $V_{cc}$ exceeds a prescribed value to insure that power consumption in the output transistor can be decreased, thereby assuring easy thermal design and suppression of the junction temperature to below an allowable value.

BRIEF DESCRIPTION OF THE DRAWINGS

FIGS. 3A and 3B illustrate waveforms of voltage and current to demonstrate the effect of the present invention.

DETAILED DESCRIPTION OF THE PREFERRED EMBODIMENT

The present invention will now be described by way of example with reference to the accompanying drawings.

Figure 1:
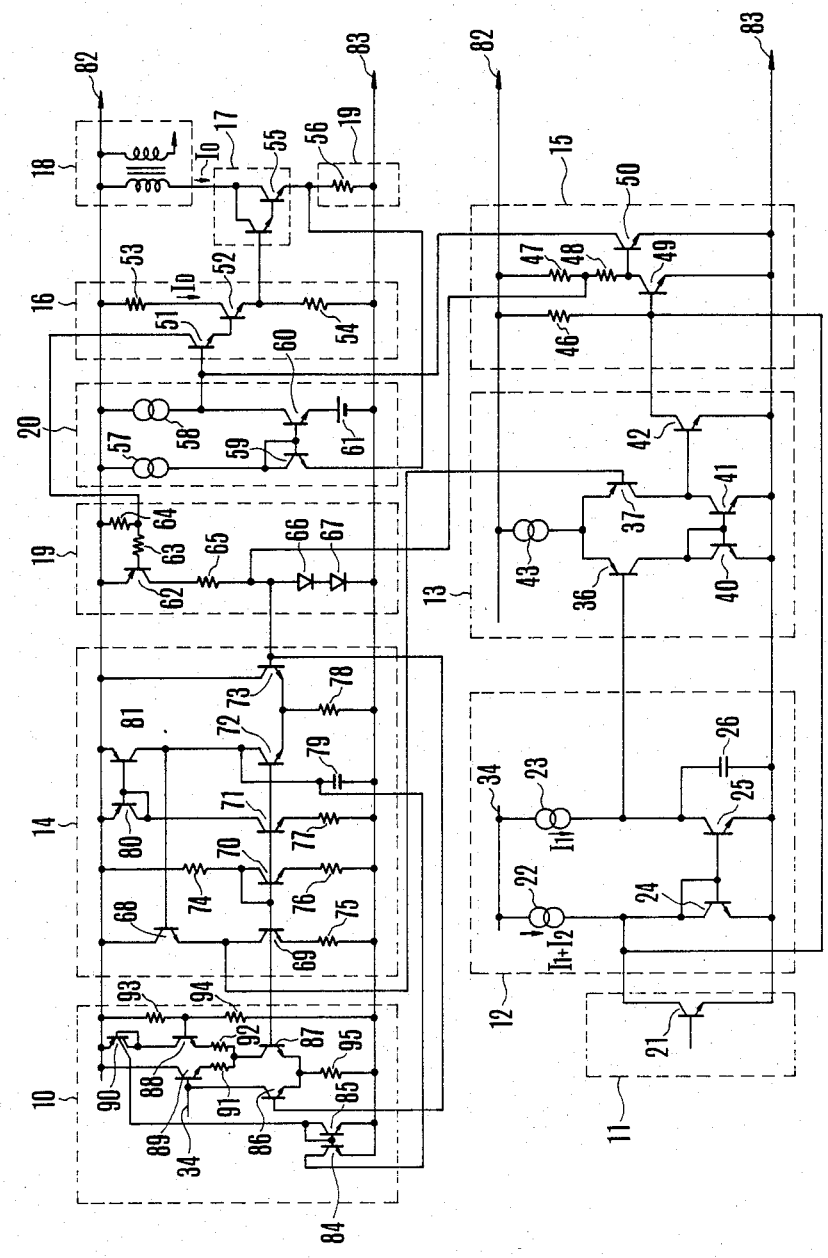
FIG. 1 is a circuit diagram of one embodiment of the present invention.

FIG. 1, is a circuit diagram of a preferred embodiment of this invention.

In FIG. 1, a signal generator 11 built in the distributor is adapted to generate an output signal synchronized with the rotation of the distributor. The output signal is a pulse waveform having a period corresponding to an engine revolution. Included in the signal generator 11 is an output transistor 21. An integration circuit 12 functions to convert the waveform of the pulse output from the signal generator 11 to a sawtooth form. It consists of constant current sources 22 and 23, transistors 24 and 25, and a capacitor 26. The constant current sources 22 and 23 deliver constant currents $I_1+I_2$ and $I_1$, respectively, and the transistors 24 and 25 constitute a current mirror. Through a line 34 constant voltage is supplied to the constant current sources. A comparison circuit 13, adapted to compare the output voltage of the integration circuit 12 with the output waveform of a comparison circuit 14, to be described later, consists of several transistors 36, 37, 40, 41 and 42, and a constant current source 43. The transistors 36 and 37 constitute a differential amplifier and the constant current source 43 feeds current to the differential amplifier. The transistors 40, 41, and 42 are loaded on the differential amplifier. The transistors 40 and 41 constitute a current mirror. An AND circuit 15 produces a logical product of the pulse output from the signal generator 11 and the pulse output from the comparison circuit 13, and it includes resistors 46, 47 and 48, and transistors 49 and 50. A drive circuit 16, for driving an output circuit 17 in response to the output pulse from the AND circuit 15, includes transistors 51 and 52 and resistors 53 and 54. The output circuit 17 is a Darlington transistor 55. An ignition coil 18 is a load and it has its primary winding connected to a collector of the Darlington transistor 55 constituting the output circuit 17 and its secondary winding connected to an ignition plug (not shown) via the distributor (not shown). An output current detection circuit 19, adapted to detect the magnitude of the output current $I_o$ flowing through the output circuit 17 and a current suppression condition of the current $I_o$ includes a transistor 62, several resistors 56, 63, 64 and 65 and serially connected diodes 66 and 67. A current suppression circuit 20 is actuated, when the output current detection circuit 19 has detected the increase of the output current $I_o$ to a prescribed magnitude, to maintain the output current $I_o$ at the prescribed magnitude. It includes constant current sources 57 and 58, transistors 59 and 60 constituting a current mirror, and a reference voltage source 61. The comparison circuit 14 receives the output pulse of the output current detection circuit 19 and produces an output voltage supplied to the comparison circuit 13 for controlling its own output voltage level in accordance with the speed of the internal combustion engine, thus adjusting the pulse width of the output current $I_o$. The comparison circuit 14 includes transistors 68, 69, 70, 71, 72, 73, 80 and 81, resistors 74, 75, 76, 77 and 78 and a capacitor 79. The paired transistors 69 and 70, 71 and 72, and 80 and 81, respectively, constitute a current mirror, and the transistors 72 and 73 constitute a differential amplifier. A control circuit 10 acts, when the power source voltage has increased beyond the prescribed level, to increase discharge current of the capacitor 79 of comparison circuit 14 so that the charged duration of the capacitor 79 is decreased. This decreases the current suppression duration of the output current $I_o$ flowing through the Darlington transistor 55. The control circuit 10 includes transistors 84, 85, 86, 87, 88, 89 and 90 and resistors 91, 92, 93, 94 and 95. The transistors 84 and 85 constitute a current mirror. The transistor 90 is of a multi-collector construction, with one of the collectors short-circuited to its base to constitute a current mirror circuit. The paired transistors 86 and 87, and 88 and 89, respectively, constitute differential amplifiers. The differential amplifier constituted by the transistors 88 and 90 serves as a load on the transistor 87 of the differential amplifier which is constituted by the transistors 86 and 87. The bases of the differential amplifier constituted by the transistor 86 and 87 and those of the differential amplifier constituted by the transistors 72 and 73 of the comparison circuit 14 are connected in common. The base of the transistor 89 is connected to the constant voltage supply line 34.

FIGS. 2A through 2G illustrate waveforms of voltage and current in the circuit of FIG. 1. The operation of the circuit of FIG. 1 will now be described with reference to FIGS. 2A to 2G.

Figure 2A:
FIGS. 2A to 2G illustrate waveforms of voltage and current in the embodiment of FIG. 1.
Figure 2B:
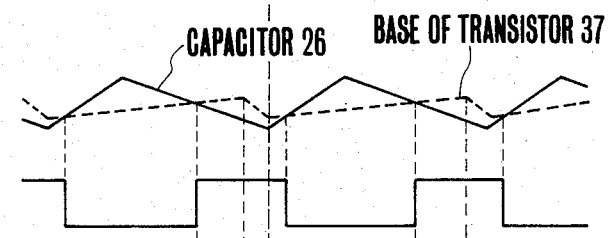

A pulse wave is developed at the collector of the output transistor 21 in the signal generator 11 as shown in FIG. 2A. This waveform is obtained through the medium of a Hall sensor, for example, and it is synchronized with an engine revolution. The integration circuit 12 receives this pulse wave. When the collector of the transistor 21 is at a low level, the transistors 24 and 25, which constitute a current mirror circuit, are cut off. Consequently, the capacitor 26 is charged with the constant current $I_1$ fed from the constant current source 23. When the transistor 21 is at a high level, the transistors 24 and 25, constituting the current mirror circuit, are turned on and the constant current, $I_1+I_2$, flows from the constant current source 22 to the collector of the transistor 25. Consequently, the capacitor 26 is discharged at a constant current $I_2$. The waveform of the charge and discharge of the capacitor 26 is indicated by a solid line in FIG. 2B.

Figure 2C:

The output of the integration circuit 12 (capacitor 26) is applied to the base of the transistor 36. The other input (to the base of the transistor 37) of the comparison circuit 13 is the output of the second comparison circuit 14 which will be described later. The comparison circuit 13 compares the waveform of the charge and discharge of the capacitor 26 and the waveform of the output from the comparison circuit 14. When the transistor 36 has a higher base voltage than that of the transistor 37, the transistor 36 is cut off and the transistor 37 is turned on. Consequently, the transistors 40 and 41, which constitute a current mirror circuit, are cut off, thereby turning on the transistor 42 decreasing its collector voltage to a low level. Conversely, when the base voltage of the transistor 36 is lower than the base voltage of the transistor 37, the transistors 40 and 41, constituting the current mirror circuit, are turned on and the transistor 42 is turned off. Consequently, the collector voltage of the transistor 42 is set to a high level as shown in FIG. 2C.

Figure 2D:
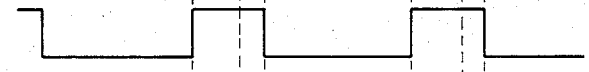
Figure 2E:
Figure 2F:

As mentioned previously, the pulse wave waveform of the output transistor 21 in the signal generator 11 is as shown in FIG. 2A. This waveform and the collector waveform of the transistor 42 are ANDed in the AND circuit 15 to produce at the collector of the transistor 50 an ANDed output as shown in FIG. 2D. This output is applied to the input (the base of the transistor 51) of the drive circuit 16. When the collector voltage of the transistor 50 is at a low level, the transistors 51 and 52 are cut off and, consequently, the output circuit 17 is cut off. When the collector voltage of the transistor 50 is at a high level, the transistors 51 and 52 are turned on. Consequently, to the base of the Darlington transistor 55 constituting the output circuit 17, there is applied a drive current $I_D$ as shown in FIG. 2E which is determined by the voltage of a power supply terminal 82, base/emitter voltage of the transistor 55, collector/emitter saturation voltage of the transistor 52, and the resistor 53. When the output circuit 17 is driven by the drive current $I_D$, the output current $I_o$ which flows through the Darlington transistor 55 is gradually increased by a time constant which is determined by the primary winding of the ignition coil. Further, this current is detected by the current detection resistor 56 of the current detection circuit 19 and converted into the voltage supplied to the current suppression circuit 20. When the output current $I_o$ reaches a prescribed value and the emitter voltage of the transistor 59 reaches the same level as the emitter voltage (determined by the reference voltage source 61) of the transistor 60, a portion of the constant current of the constant current source 57 flowing into the transistor 59 decreases and a portion thereof flowing into the conductance of the transistor 60 increases. Consequently, the transistor 60 is amply driven. Therefore, a portion; the constant output current of the constant current source 58, flowing into the transistor 60 is increased and a portion flowing into the input of the drive circuit 16 (the base of the transistor 51) is decreased. As a result, the drive current $I_D$ is also decreased as shown in FIG. 2E. Thus, the output current $I_o$ is so suppressed as to be maintained at the prescribed magnitude which is determined by the current detection resistor 56 and the reference voltage source 61 as shown in FIG. 2F.

Figure 2G:

When the output of the AND circuit 15 (the collector of the transistor 50) is at the low level, the collector of the transistor 49 is at a high level. Thus, the diodes 66 and 67 are turned on and the base of the transistor 73 is set to a high level. When the output of the AND circuit 15 is at the high level and the output current $I_o$ is ready for current suppression, the transistor 51 is amply driven and the diodes 66 and 67 are turned on through the medium of the resistors 63 and 64 and the transistor 62. When the output current $I_o$ has entered the status of current suppression, the collector current of the transistor 51 is decreased, the transistor 62 is cut off and, consequently, the diodes 66 and 67 are also cut off. The output of the current detection circuit 19, therefore, assumes a pulse waveform which falls to a low level only when the output current is under current suppression, as shown in FIG. 2G.

The comparison circuit 14 uses the output pulse from the output current detection circuit 19 (FIG. 2G) as its input. When the base of the transistor 73 is at a high input, the transistor 72 is cut off and, consequently, the collector current of the transistor 81 constituting the current mirror circuit is fed to the capacitor 79 to charge it. When the base of the transistor 73 is at a low level (under current supression); the capacitor 79 is discharged because the transistor 73 is cut off and the transistor 72 is turned on. The waveform of the charge and discharge of the capacitor 79 is used as the input to the comparison circuit 13 via the transistor 68. In other words, it is applied to the base of the transistor 37.

As described above, the output pulse has its width controlled by the feedback loop.

If the power source voltage is below the prescribed level, since the resistors 93 and 94 are set so that the base voltage of the transistor 88 of the control circuit 10 may remain below the base voltage of the transistor 89 connected to the constant voltage supply line 34, the transistor 88 constituting the differential amplifier is cut off. A the result, the transistors 90, 84, and 85, constituting the current mirror circuits, are also cut off. The discharge of the capacitor 79, therefore, is carried out solely through the transistor 72.

When the regulator or some other element responsible for the adjustment of the battery as a power source becomes defective and, consequently, the power source voltage increases with the base voltage of the transistor 88 exceeding the base voltage of the transistor 89, the transistor 88, which constitutes the differential amplifier, is turned on. Here, the base of the transistor 86, which forms one of the input terminals of the differential amplifier constituted by the transistors 86 and 87, is connected to the output terminal of the output current detection circuit 19 (the anode of the diode 66) and the base of the transistor 87 which forms the other input terminal is connected to the base of the transistor 72. When the output current $I_o$ is under current suppression, therefore, the anode of the diode 66 is set to a low level and, consequently, the transistor 87 is turned on. Since the transistors 87 and 90 are then turned on, the transistor 90, and the transistors 84 and 85, constituting the current mirror circuit, are also turned on. Consequently, the capacitor 79 is discharged by the two transistors 72 and 84 when the power source voltage increases beyond the prescribed level.

To describe the effects of the present invention, reference is now made to FIGS. 3A and 3B. As described above, when the power source voltage goes beyond the prescribed level, the capacitor 79 discharges rapidly through the two transistors 72 and 84 and at the same time, the amount of discharging current increases as compared to the conventional circuit without the control circuit 10. On the other hand, in both the conventional and the present circuits, the capacitor 79 completes discharging when the input pulse, as shown in FIG. 2A, changes from high level to low level. Therefore, the level of the capacitor 79 becomes lower by a difference $V_d$ in the present invention than in the conventional circuit when the discharge has completed.

In both the present and conventional circuits, the capacitor 79 is charged through the transistor 81 so that the conventional charging waveform as shown by the dotted waveform, and the present charging waveform, shown by the solid waveform, have the same ramp.

For these reasons, while the conventional capacitor level waveform crosses the waveform indicative of the base level of the transistor 36 at a point $P_1$, the present capacitor level waveform crosses the base level waveform at a point $P_2$. Thus, the output current I rises, as shown by the dotted line in FIG. 3B, in the conventional circuit without the control circuit 10, whereas it rises, as shown by the solid line to decrease the entire width of the output current. Also, the duration $T_2$ of the current suppression of the output current $I_o$ can be notably decreased as compared to the duration $T_1$. It is readily noted from the equation (4) that the electric power consumed by the Darlington transistor 55 is decreased to a great extent because the term D (the percentage of the duration of current suppression to the period of signal) is decreased.

In the previous embodiment, the magnitude of the power source voltage at which the control circuit 10 is actuated is fixed at about 15 V on the assumption that this circuit is used as an ignition unit for an internal combustion engine and it is operated with a built-in battery. In this connection, resistances of the resistors 93 and 94 are fixed at 10kΩ and 3kΩ, and the value of voltage applied to the base of the transistor 89 is fixed at 3.3 V.

As described above, this invention decreases the duration of current suppression of the output current flowing through the output transistor and, consequently, permits a notable saving in the power consumption whenever the power source voltage increases beyond the prescribed level. The invention, therefore, assures an advantage that heat design and other similar tasks are fulfilled with great ease particularly when the circuit is produced in the form of a thick-film hybrid integrated circuit.

Figure 4:
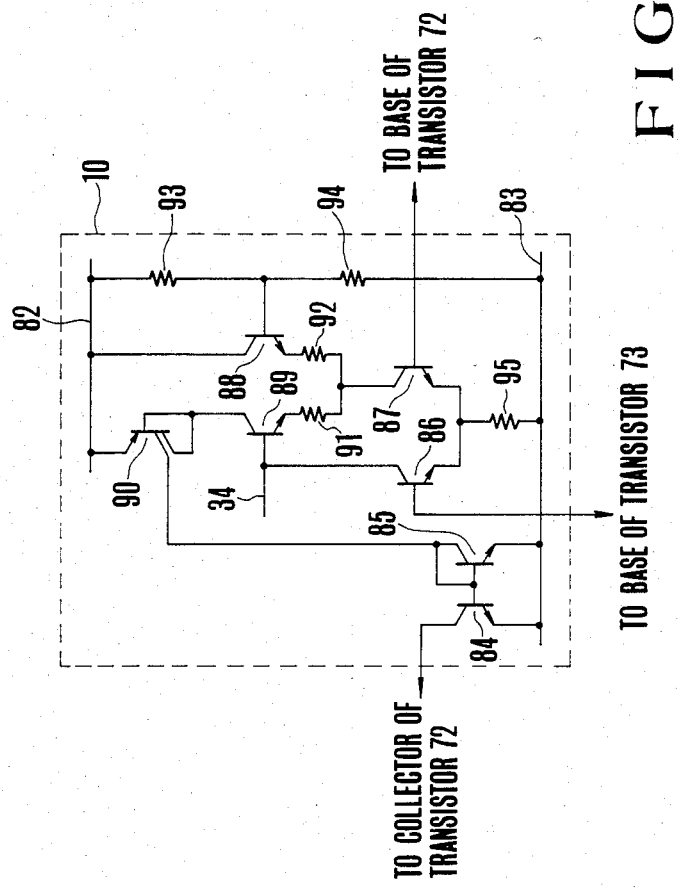
FIG. 4 is a circuit diagram illustrating a modification of the present invention.

FIG. 4 shows a modified embodiment of the control circuit 10 according to the present invention. This control circuit is intended for use in a device which is desired to produce an amply large output pulse width at a high power source voltage. Contrary to the embodiment of FIG. 1, in this modified arrangement, a transistor 90 of multiple collector type is connected to the collector of a transistor 89 constituting a differential amplifier together with a transistor 88.

What is claimed is:

1. A pulse width control circuit for use with an ignitor of an internal combustion engine comprising:
   an integration circuit receiving a periodic input signal representative of a revolution of the engine for producing a first sawtooth waveform;
   a first comparator circuit comparing the first sawtooth waveform with a second sawtooth waveform for producing a low level output when said first sawtooth waveform exceeds the second sawtooth waveform and a high level output when the former decreases below the latter;
   an AND circuit for ANDing the output of said first comparator circuit and said periodic input signal;
   an output circuit for controlling output current flowing through a load in the form of an ignition coil of said ignitor;
   a drive circuit responsive to the output of said AND circuit for driving said output circuit;
   a current suppression circuit responsive to a voltage proportional to the output current detected by an output current detection circuit for controlling current flowing through said drive circuit so that a negative feedback is applied to said output circuit to suppress said output current, said output current detection circuit being responsive to said current flowing through said drive circuit and the output condition of said AND circuit;
   a second comparator circuit for producing said second sawtooth waveform, the descent of said second sawtooth waveform beginning with decrease of said current flowing through said drive circuit and having a duration which defines a duration of the current suppression; and
   a control circuit responsive to power source voltage and the output of said output current detection circuit for decreasing the current suppression duration when power source voltage exceeds a prescribed value.

2. A pulse width control circuit comprising:
   pulse generator means responsive to an input signal for generating a pulse signal;
   output generator means for generating an output signal in response to said pulse signal;
   means responsive to the current of said output signal equaling a predetermined value for generating a current detection signal;
   first feedback loop means connected to said output generator means for controlling the magnitude of the current of said output signal in response to said current detection signal;
   means for generating a voltage detection signal in response to the voltage applied to at least said output generator means exceeding a predetermined value; and
   second feedback loop means connected to said pulse generator means for controlling the pulse width of said pulse signal in response to said voltage detection signal and thereby controlling the pulse width of said output signal.

3. The pulse width control circuit as claimed in claim 2 wherein said first feedback loop means modifies said output signal in response to said current detection signal to suppress the magnitude of the current of the output signal to a predetermined maximum value.

4. The pulse width control circuit as claimed in claim 2 wherein said second feedback loop means narrows the pulse width of said pulse signal in response to said voltage detection signal.

5. A combination comprising:
   an input circuit for producing a first sawtooth signal in response to an input signal;
   a first comparator for comparing said first sawtooth signal with a second sawtooth signal to generate a first pulse signal, the pulse width of said first pulse signal dependent upon the bias level of said second sawtooth signal;
   a drive circuit for producing a second pulse signal in response to said input signal and said first pulse signal;
   an output circuit for generating an output signal having a pulse width determined by said second pulse signal and a current limited to a predetermined value in response to a current detection signal;
   a current detection circuit for generating said current detection signal in response to the current of said output signal reaching said predetermined value;
   a voltage detection circuit for generating a voltage detection signal in response to the voltage applied to at least said output circuit exceeding a predetermined value; and
   a feedback circuit for generating said second sawtooth signal having a first bias level in the absence of said voltage detection signal and havng a second bias level in response to said voltage detection signal.

* * * * *

UNITED STATES PATENT AND TRADEMARK OFFICE
CERTIFICATE OF CORRECTION

PATENT NO. : 4,509,494

DATED : April 9, 1985

INVENTOR(S) : Shigeo Nishitoba, et al.

Sheet 1 of 2

It is certified that error appears in the above-identified patent and that said Letters Patent is hereby corrected as shown below:

Column 6, line 57, after "waveform" insert a comma ---- , ----.

Column 6, line 59, delete "same ramp" and insert ---- same slope ----.

Column 6, line 64, delete "I rises" and insert ---- $I_0$ rises ----.

In The Claims

Column 8, line 63, delete "havng" and insert ---- having ----.

UNITED STATES PATENT AND TRADEMARK OFFICE
CERTIFICATE OF CORRECTION

PATENT NO. : 4,509,494
DATED : April 9, 1985
INVENTOR(S) : Shigeo Nishitoba, et al.

Sheet 2 of 2

It is certified that error appears in the above-identified patent and that said Letters Patent is hereby corrected as shown below:

Column 2, line 2, delete "$P_c=V_{cc}-I_{L1} \cdot R_{L1}$" and insert ---- $V_c=V_{cc}-I_{L1} \cdot R_{L1}$ ----.

Column 2, line 8, delete "$T_c=(V_{cc}-I_{L1} \cdot R_{L1}) \cdot I_{L1}$ D" and insert ---- $P_c=(V_{cc}-I_{L1} \cdot R_{L1}) \cdot I_{L1}$ D ----.

Column 5, line 34, before "transistor 60" insert ---- conductance of the ----.

Column 6, line 15, delete "A the result," and insert ---- As a result, ----.

Signed and Sealed this

Twenty-seventh Day of August 1985

[SEAL]

Attest:

DONALD J. QUIGG

Attesting Officer

Acting Commissioner of Patents and Trademarks